(12) United States Patent
Matsushita et al.

(10) Patent No.: US 6,214,701 B1
(45) Date of Patent: Apr. 10, 2001

(54) SEMICONDUCTOR SUBSTRATE AND THIN FILM SEMICONDUCTOR DEVICE, METHOD OF MANUFACTURING THE SAME, AND ANODIZING APPARATUS

(75) Inventors: Takeshi Matsushita; Misao Kusunoki; Takaaki Tatsumi, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/215,314

(22) Filed: Dec. 18, 1998

(30) Foreign Application Priority Data

Dec. 26, 1997 (JP) .................................................. 9-360428

(51) Int. Cl.$^7$ .................................................. H01L 21/46
(52) U.S. Cl. .................. 438/458; 438/405; 438/409; 438/455; 438/960; 438/977
(58) Field of Search .................. 438/406, 409, 438/455–459, 960, 977

(56) References Cited

U.S. PATENT DOCUMENTS

| | | | | |
|---|---|---|---|---|
| 4,104,090 | * | 8/1978 | Pogge .................... | 148/175 |
| 5,164,033 | | 11/1992 | Whiteland ............... | 156/345 |
| 5,811,348 | * | 9/1998 | Matsushita et al. ....... | 438/455 |
| 5,854,123 | * | 12/1998 | Sato et al. .............. | 438/507 |
| 5,863,412 | * | 1/1999 | Ichinose et al. ......... | 205/652 |
| 6,054,363 | * | 4/2000 | Sakaguchi et al. ........ | 438/406 |

FOREIGN PATENT DOCUMENTS

| | | |
|---|---|---|
| 0 501 119 | 9/1992 | (EP) . |
| 0 536 788 | 4/1993 | (EP) . |
| 0 553 857 | 8/1993 | (EP) . |
| 0797258 | 9/1997 | (EP) . |
| 02164023 | 6/1990 | (JP) . |
| 2-164023 | 6/1990 | (JP) . |

* cited by examiner

Primary Examiner—Charles Bowers
Assistant Examiner—William M. Brewster
(74) Attorney, Agent, or Firm—Sonnenschein, Nath & Rosenthal (57) ABSTRACT

A semiconductor substrate, a thin film semiconductor device, a manufacturing method thereof and an anodizing apparatus which can reduce the manufacturing cost and save the resources are provided. According to this invention, a semiconductor thin film is formed through a separation layer of a porous semiconductor on a substrate body of sapphire; the semiconductor thin film is separated from the porosity layer and used for a thin film semiconductor device; and the substrate body from which the semiconductor thin film is separated is used again after the separation layer attached thereto is removed by etching. Since sapphire has high strength, high rigidity, high resistance to wearing, high heat resistance, high abrasion resistance and high chemicals resistance, no deterioration and no damage occur even when the substrate body is repetitively used. Thus, the recycle frequency can be increased, and the reduction of the manufacturing cost and the saving of the resources can be promoted.

2 Claims, 7 Drawing Sheets

SEMICONDUCTOR SUBSTRATE AND THIN FILM SEMICONDUCTOR DEVICE, METHOD OF MANUFACTURING THE SAME, AND ANODIZING APPARATUS

BACKGROUND OF THE INVENTION

The present invention relates to a semiconductor substrate having a semiconductor thin film formed at one surface side of a substrate body a separation layer, a thin film semiconductor device formed by using the semiconductor substrate, a manufacturing method of the semiconductor substrate and the thin film semiconductor device, and an anodizing apparatus.

In the technical field of thin film semiconductor devices such as solar batteries, for example, there has been promoted such a research that a semiconductor thin film of silicon is formed on the substrate body of a substrate of silicon (Si) through a porous separation layer, and then the semiconductor thin film is separated from the substrate body through the separation layer to reuse the semiconductor substrate (Japanese Unexamined Patent Publication No. Hei-8-213645). The method can contribute to resource-saving and cost-down. In order to reuse the substrate body as described above, it is required to easily separate the semiconductor thin film and the substrate body from each other, and it has been considered that the separation layer is formed of a porous layer whose porosity is varied.

Figure 1A:
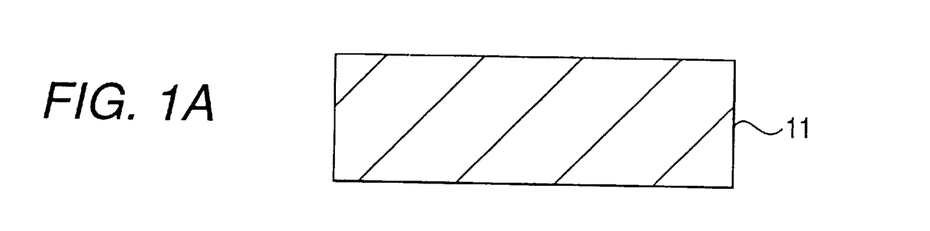
FIGS. 1A to 1E are each step diagrams showing a conventional method of manufacturing a semiconductor substrate and a thin film semiconductor device.
Figure 1B:
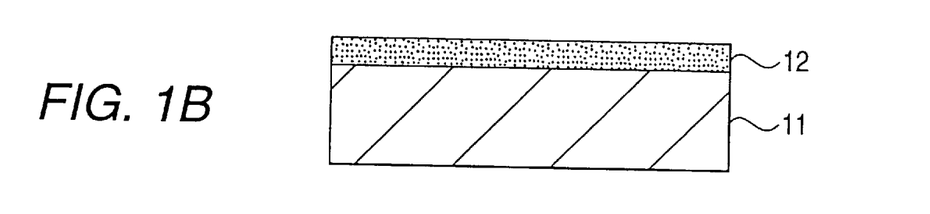
Figure 1C:
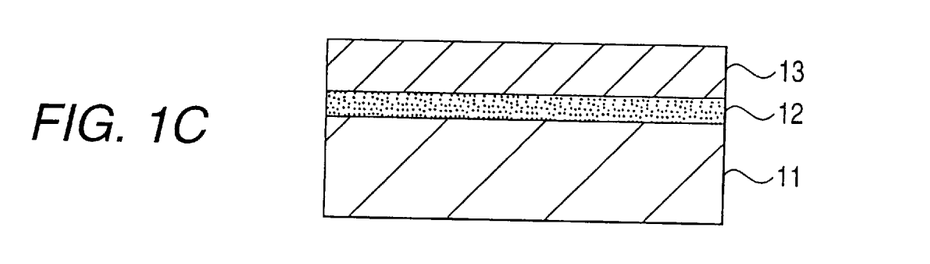
Figure 1D:
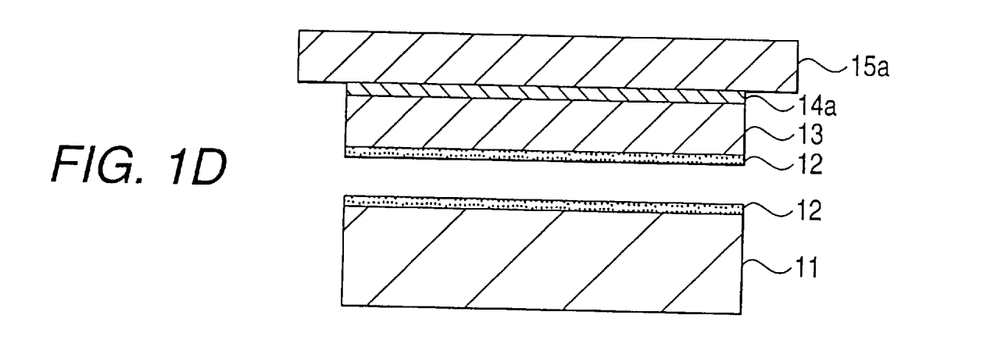
Figure 1E:
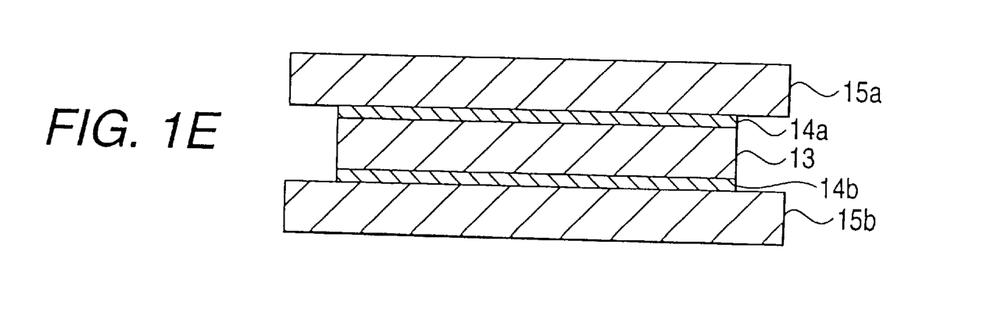
Figure 2:
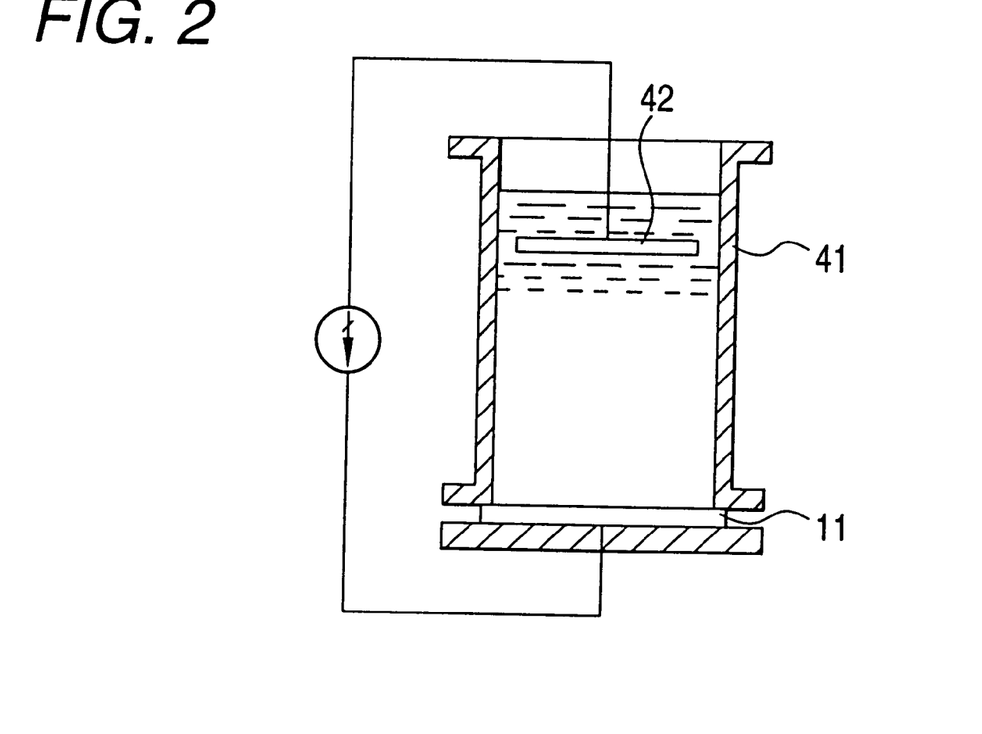
FIG. 2 is a cross-sectional view showing the construction of a conventional anodizing apparatus.
Figure 3:
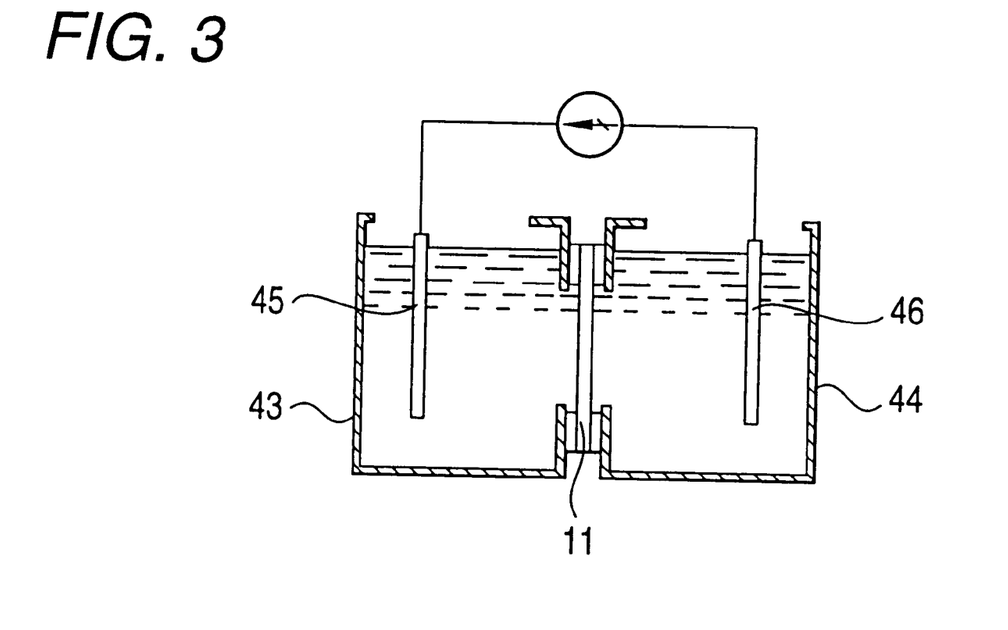
FIG. 3 is a cross-sectional view showing another conventional anodizing apparatus.

For example, the thin film semiconductor device can be formed as illustrated in FIGS. 1A to 1E. That is, a substrate body 11 made of p-type single crystal silicon having resistance of 0.01 to 0.02 Ωcm is prepared (see FIG. 1A); and a porous separation layer 12 is formed at one surface side of the substrate body by anodization (see FIG. 1B). In the anodization process, current is supplied to the substrate body 11 serving as an anode with electrolyte. As shown in FIG. 2, for instance, the current is supplied while an electrolyte tank 41 is disposed at the one surface side of the substrate body 11 and an electrode 42 is disposed in the electrolyte tank 41. Alternatively, as shown in FIG. 3, the current supply is performed while the substrate body 11 is disposed between two electrolyte tanks 43 and 44 and electrodes 45 and 46 are disposed in the electrolyte tanks 43 and 44, respectively.

In the anodization process, a low-porous layer of low porosity is formed on the surface by supplying current at a low current density of 0.5 to 3 mA/cm$^2$ for 8 min. Thereafter, a middle-porous layer of intermediate-level porosity is formed inside by supplying current at a middle current density of 3 to 20 mA/cm$^2$ for 8 min., and then a high-porous layer of high porosity is formed inside the middle-porous layer by supplying current at a high current density of 40 to 300 mA/cm$^2$ for several seconds. After forming a separation layer 12, a heat treatment is performed to form a semiconductor thin film 13 on the surface of the separation layer 12 (see FIG. 1C). Next, an adhesive substrate 15a is adhesively attached to the surface of the semiconductor thin film 13 through an adhesive layer 14a, and then pulled to separate the semiconductor thin film 13 from the substrate body 11 and transfer it to the adhesive substrate 15a (see FIG. 1D). The separation layer 12 adhering to the separated semiconductor thin film 13 is removed therefrom, and an adhesive substrate 15b is adhesively attached to the semiconductor thin film 13 through an adhesive layer 14b, thereby achieving a thin film semiconductor device such as a solar battery or the like (see FIG. 1E). On the other hand, the substrate body 11 is used again to form a semiconductor thin film 13 after the separation layer 12 is removed therefrom.

However, since single crystal silicon constituting the substrate body 11 has a cleavage face, the mechanical strength of the substrate body 11 is low, and the substrate body 11 is easily broken at the cleavage face even by small external force. Upon repetitive use of the substrate body 11, the mechanical strength of the substrate body 11 is further lowered due to increase of crystal defects through a heat treatment. Furthermore, if the substrate body 11 is handled with no stress in order to increase the recycle frequency or if a temperature increasing time and a temperature decreasing time are set to longer values so that no crystal defect occurs, a long time is needed for the manufacturing process. Accordingly, there has been such a problem that it is difficult to increase the recycle frequency of the substrate body 11.

In order to reuse the substrate body 11, the separation layer 12 remaining on the surface of the substrate body 11 must be removed after the semiconductor thin film 13 is separated, thereby keeping a good surface condition. Therefore, an etching treatment, and if occasion demands, a surface polishing or electrolytic polishing treatment are needed. Therefore, the repetitive recycle causes reduction of the thickness of the substrate body 11, and thus the recycle frequency is limited. In addition, the number of steps such as the surface polishing step, etc. to promote the recycle is increased, so that the manufacturing cost is increased.

In addition, if an elongated substrate 11 is achieved to obtain a large area, a single crystal silicon ingot having a cylindrical shape must be cut out along its longitudinal direction, so that a larger unusable portion occupies in the ingot, that is, there occurs a problem that material is wasted.

As means of solving these problems, it may be considered that the substrate 11 is composed of sapphire. Sapphire has high strength, high rigidity, high wear resistance, high heat resistance, high abrasion resistance, and high chemicals resistance, and it is well known as a material constituting a reusable semiconductor monitor wafer. Also, it can provide large-aperture single crystal, and can provide a large-area thin film semiconductor device. Further, it was reported by Manasevit et al. in 1964 that a single crystal silicon layer can be formed on the surface of sapphire.

However, in order to separate the large-area semiconductor thin film 13 from the substrate body 11, the separation layer 12 having uniform porosity over the large area must be formed on the surface of the substrate body 11. The anodization process is suitably used as a method of forming such a separation layer 12, and it is preferable that a silicon layer is formed on the surface of the substrate body 11 and made porous by the anodization process. However, sapphire is an insulator unlike p-type silicon which has been hitherto used as a constituent material of the substrate body 11, so that no current can be passed therethrough by a conventional anodizing apparatus shown in FIG. 2 or 3 and thus it cannot be made porous. That is, such a manufacturing problem occurs when the substrate body 11 of sapphire is used to solve the above problem.

SUMMARY OF THE INVENTION

The present invention has been made in view of the above problem, and has an object to provide a semiconductor substrate and a thin film semiconductor device, a method of manufacturing the same and an anodizing apparatus which can reduce the manufacturing cost and save the resources.

The semiconductor substrate according to the present invention has a substrate body of sapphire and a semiconductor thin film which is formed through a separation layer at one surface side of the substrate body.

The thin film semiconductor device according to the present invention includes the semiconductor thin film which is formed through the separation layer at one surface side of the substrate body of sapphire, and is separated through the separation layer and transferred to an adhesive substrate.

A method of manufacturing a semiconductor substrate according to the present invention comprises a growth layer forming step of forming a porosity layer of semiconductor at one surface side of a substrate body of sapphire, a separation layer forming step of making the porosity layer porous to form a separation layer, and a semiconductor thin film forming step for forming a semiconductor thin film at the opposite side of the separation layer to the substrate body.

A method of manufacturing a thin film semiconductor device comprises a semiconductor thin film forming step of forming a semiconductor thin film through a separation layer at one surface side of a substrate body of sapphire, and a separation step of separating the semiconductor thin film from the substrate body through the separation layer, and transferring it to an adhesive substrate.

An anodizing apparatus of the present invention makes a porosity target porous, and it includes an electrolyte tank for accommodating electrolyte, and a pair of electrodes which are immersed in the electrolyte stocked in the electrolyte tank, and relatively movable at one surface side of the porosity target disposed so as to be brought into contact with the electrolyte.

In the semiconductor substrate of the present invention, the substrate body is formed of sapphire which has high strength, high rigidity, high resistance to wearing, high heat resistance, high abrasion resistance and high chemicals resistance and can provide large-aperture single crystal.

The thin film semiconductor device according to the present invention is formed by using the semiconductor substrate of the present invention.

In the semiconductor substrate manufacturing method of the present invention, the porosity layer is first formed at one surface side of the substrate body of sapphire. Subsequently, the porosity layer is made porous and becomes the separation layer, thereby forming the semiconductor thin film.

In the method of manufacturing the thin film semiconductor device according to the present invention, the semiconductor thin film is formed through the separation layer at one surface side of the substrate body of sapphire. Thereafter, the semiconductor thin film is separated through the separation layer and transferred to the adhesive substrate.

In the anodizing apparatus of the present invention, the electrolyte is stocked in the electrolyte tank and the porosity target is disposed so as to be brought into contact with the electrolyte. Further, a pair of electrodes are immersed in the electrolyte and current is supplied while being relatively moved at one surface side of the porosity target, whereby the porosity target is made porous.

BRIEF DESCRIPTION OF THE DRAWINGS

FIG. 8 shows a construction of an anodizing apparatus of the present invention, wherein

DESCRIPTION OF THE PREFERRED EMBODIMENTS

Embodiments according to the present invention are described in detail with reference to the drawings. In the following embodiments, together with a semiconductor substrate, a thin film semiconductor device formed by using the semiconductor substrate and an anodizing apparatus used when the thin film semiconductor device is manufactured will be described.

(First Embodiment)

Figure 4:
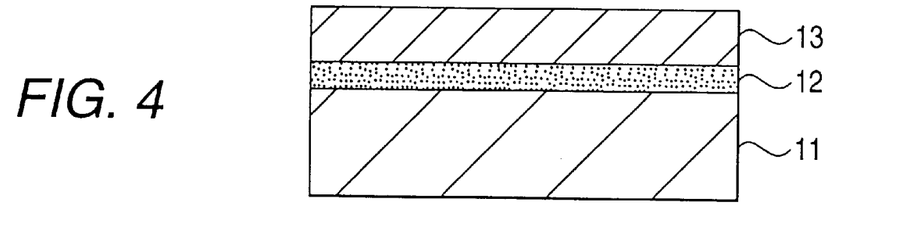
FIG. 4 is a cross-sectional view showing the construction of a semiconductor substrate according to a first embodiment of the present invention.

FIG. 4 shows the construction of a semiconductor substrate according to a first embodiment of the present invention. In the semiconductor substrate, a semiconductor thin film 13 is formed through a separation layer 12 at one surface side of a substrate body 11. The substrate body 11 is formed of sapphire which has high strength, high rigidity, high resistance to wearing, high heat resistance, high abrasion resistance and high chemicals resistance. For the substrate body 11 is used plate-shaped (for example, 20 cm in width, 100 cm in length and 0.1 cm in thickness) single crystal made by EFG (Edge-defined Film-fed Growth) method which can achieve crystal having a large aperture and any sectional shape, for example.

The separation layer 12 is formed of porous semiconductor, for example. As the semiconductor constituting the separation layer 12 is used single crystal or polycrystal silicon, germanium (Ge), mixed crystal of silicon and germanium (SiGe mixed crystal) or gallium nitride (GaN). Particularly, silicon is preferable. This is because even when crystal is grown on the surface of the substrate body 11 of sapphire, excellent crystallinity can be achieved.

The semiconductor constituting the separation layer 12 may be a p-type semiconductor doped with p-type impurities, an n-type semiconductor doped with n-type impurities or a semiconductor doped with no impurities. However, in this embodiment, the separation layer 12 is made porous by the anodization as described later, so that it is preferable that the separation layer 12 is formed of a p-type semiconductor of about 0.01 to 0.02 Ωcm in resistivity.

The thickness (the thickness in the direction perpendicular to the surface of the substrate body 11) of the separation layer 12 is equal to 1 to 10 $\mu$m (suitably 5 $\mu$m), and the porosity is varied in the thickness direction. For example, the porosity is low in the neighborhood of the semiconductor thin film 13, and the porosity is more increased from the vicinity of the semiconductor thin film 13 toward the vicinity of the substrate body 11. It is preferable to reduce the porosity in the neighborhood of the semiconductor thin film 13 as described above because the semiconductor thin film 13 having excellent crystallinity can be formed on the surface thereof. The porosity of a portion of the separation layer 12 which has the highest porosity is preferably equal to about 40 to 70%. This is to easily separate the semiconductor thin film 13 and the substrate body 11 from each other.

The semiconductor thin film 13 is formed of semiconductor such as silicon single crystal or polycrystal, germanium, silicon/germanium mixed crystal, gallium arsenide (GaAs), gallium phosphide (GaP) or gallium nitride. The semiconductor constituting the semiconductor thin film 13 may be the same as or different from the semiconductor constituting the separation layer 12. The thickness of the semiconductor thin film 13 (the thickness in the direction perpendicular to the surface of the substrate body 11) is preferably equal to 1 to 50 $\mu$m, and it is suitably selected in accordance with an application purpose.

Figure 5:
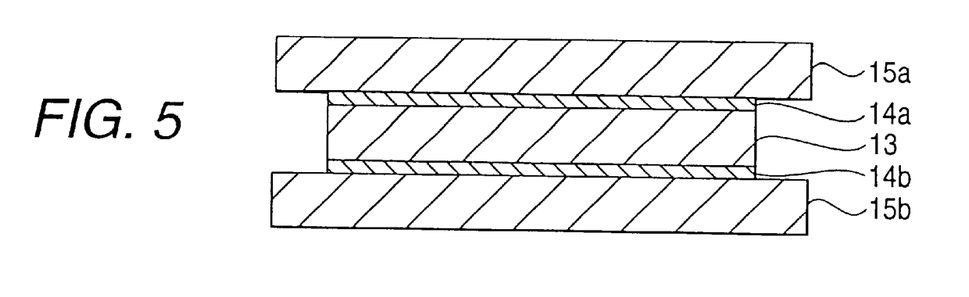
FIG. 5 is a cross-sectional view showing the construction of a thin film semiconductor device according to a first embodiment.

The semiconductor thin film 13 is separated from the substrate body 11 through the separation layer 12, and used for the thin film semiconductor device. FIG. 5 shows the construction of the thin film semiconductor device. In this thin film semiconductor device, adhesive substrates 15a, 15b are attached to a pair of surfaces of the semiconductor thin film 13 through adhesive layers 14a, 14b. The thin film semiconductor device is used as a light receiving element such as a solar cell, or a light emitting element, a liquid crystal display device or an integrated circuit.

The adhesive layers 14a, 14b are formed of proper adhesive such as photocurable resin adhesive or the like. The adhesive substrate 15 is formed of insulator such as transparent resin such as polyethylene terephthalate (PET) or polycarbonate, glass or the like, metal such as stainless or the like, semiconductor such as silicon or the like.

The semiconductor substrate and the thin film semiconductor device thus constructed can be manufactured as follows.

Figure 6A:
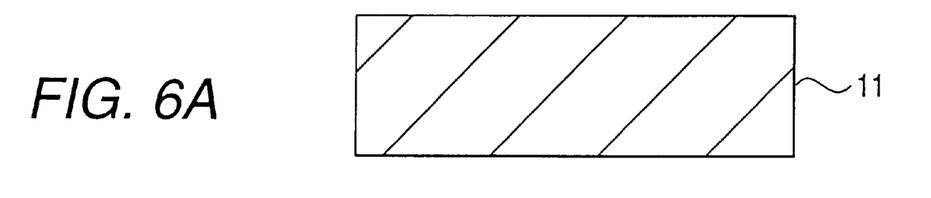
FIGS. 6A to 6D are each step diagrams showing the manufacturing method of the semiconductor substrate shown in FIG. 4 and the thin film semiconductor device shown in FIG. 5.
Figure 6B:
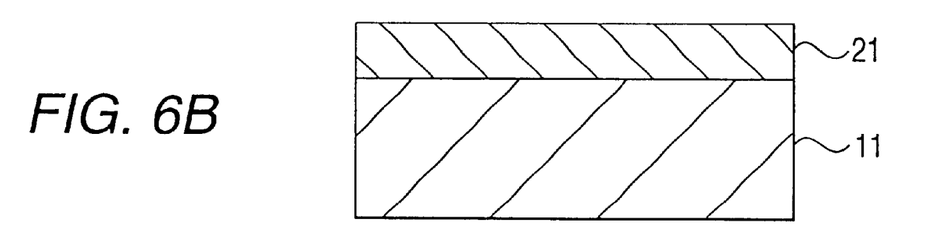
Figure 6C:
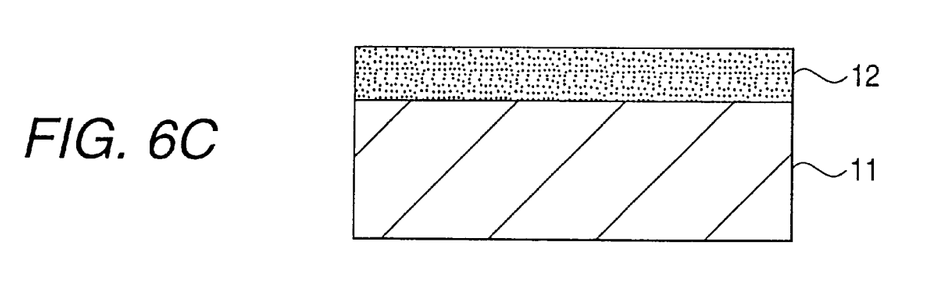

FIGS. 6A to 7C show each manufacturing step. In this embodiment, first, as shown in FIG. 6A, the substrate body 11 of sapphire single crystal which is formed by the EFG method is prepared. Subsequently, as shown in FIG. 6B, the porosity layer 21 of p-type semiconductor is formed at one surface side of the substrate body 11. For example, the porosity layer 21 which is formed of p-type silicon at a thickness of 1 to 10 $\mu$m by using silane gas ($SiH_4$) and doping boron (B) is epitaxially grown by CVD (chemical vapor deposition) method (porosity layer forming step). Subsequently, as shown in FIG. 6C, anodization is performed to make the porosity layer 21 porous, thereby forming the separation layer 12 (separation layer forming step).

Figure 8A:
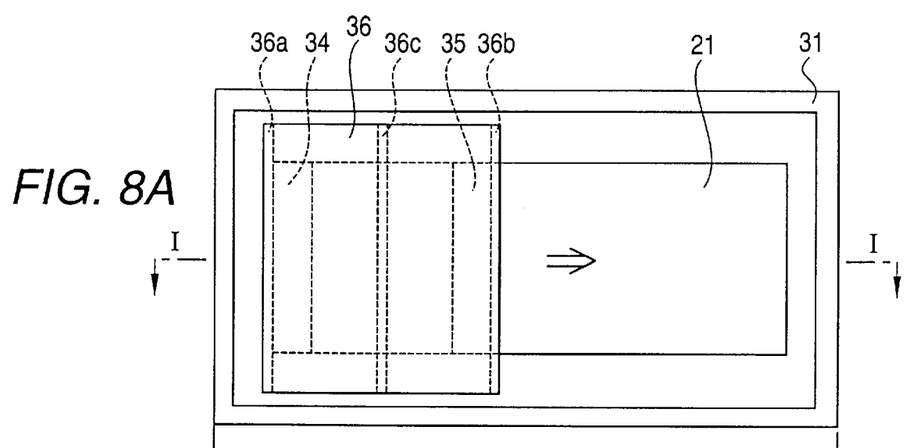
FIG. 8A is a plan view.
Figure 8B:
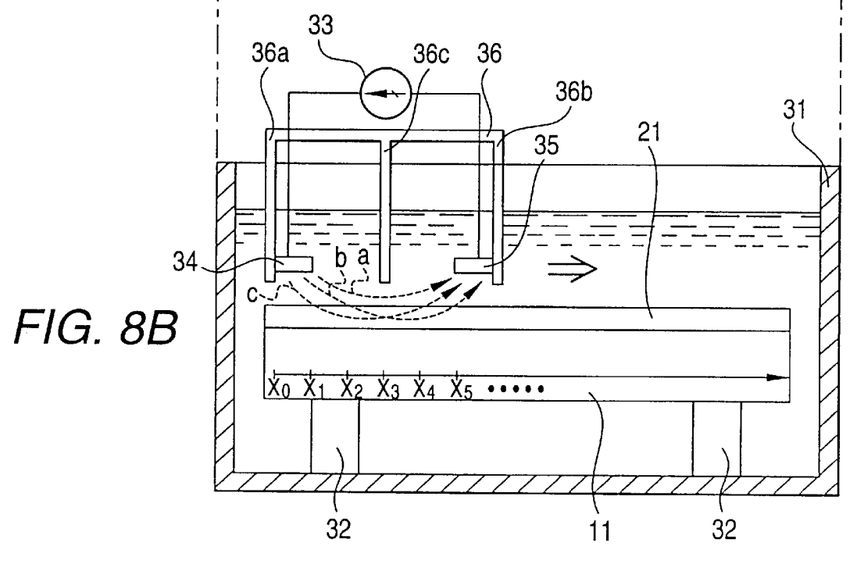
FIG. 8B is a cross-sectional view taken along I—I line of FIG. 8A.

FIG. 8 shows the construction of the anodizing apparatus used in this embodiment, wherein FIG. 8A is a plan view, and FIG. 8B is a cross-sectional view taken along I—I line of FIG. 8A. The anodizing apparatus has an electrolyte tank 31 in which suitable electrolyte (for example, mixture liquid of hydrogen fluoride (HF) solution and ethyl alcohol ($C_2H_5OH$)) is stocked, and a mount stand 32 for mounting a porosity target (in this case, the substrate body 11 on which the porosity layer 21 is formed) in the electrolyte is provided inside the electrolyte tank 31. The anodizing apparatus has a pair of electrodes 34, 35 formed of platinum (Pt) connected to a DC power source 33. The electrodes 34, 35 are movably supported at one surface side of the substrate body 11 by a support member 36. The electrodes 34, 35 are designed in a plate shape, and disposed so that the plate surfaces thereof are confronted to the porosity layer 21. As not shown, micro-holes may be formed in the electrodes 33, 34 so that hydrogen (H2) occurring in the anodization process is discharged upwardly.

The support member 36 includes support plates 36a, 36b for supporting the electrodes 34, 35 respectively, and a shielding plate 36c provided therebetween (at the substantially intermediate portion therebetween). The shielding plate 36b is used to shield current which flows not through the porosity layer 21, but through only the electrolyte between the pair of electrodes 34, 35 (in the figure, current indicated by an arrow a). The support member 36 is disposed so that a gap is kept between the porosity layer 21 and the support plates 36a, 36a, the shielding plate 36c.

However, it is preferable that the gap between the shielding plate 36c and the porosity layer 21 is not larger than required, and it is preferably set to 0.5 mm or less. If the gap is larger, the amount of current which flows through no porosity layer 21 between the pair of electrodes 34, 35 is increased. It may be adopted that at least a part of the shielding plate 36c at the porosity layer 21 side is constructed by a material which is not solved in the electrolyte and is flexible (for example, polytetrafluoroethylene resin is modified into a flexible and strong fabric structure), the length thereof is set to be longer than the support plates 36a, 36b and the shielding plate 36c is brought into contact with each other. By enhancing the resistivity of the electrolyte (for example, reducing the concentration of hydrogen fluoride), the amount of current which flows through no porosity layer 21 between the pair of electrodes 34, 35 may be reduced.

Further, the distance between the support plate 36a and the support plate 36b is preferably short, and it is set to 10 cm or less, preferably to 4 cm or less. This is to reduce the size of the apparatus, and reduce an area having a non-uniform current density as much as possible because the density of current flowing into the porosity layer 21 is varied in accordance with the positional relationship between the electrodes 34, 35 as described later, so that the porosity layer 21 is made uniformly porous.

By using the anodizing apparatus as described above, the current can be passed through the porosity layer 21 formed on the surface of the insulating substrate body 11 through the electrolyte by passing the current between the pair of electrodes 34, 35, so that the substrate body 11 can be made porous.

Accordingly, in this case, the separation layer 12 is formed by using the anodizing apparatus. That is, the electrolyte is stocked in the electrolyte tank 31, and also the substrate body 11 is mounted on the mount table 32 with the porosity layer 21 placed face up. Current is supplied between the pair of electrodes 34, 35 while moving the pair of electrodes 34, 35 in the neighborhood of the upper surface of the porosity layer 21 by the support member 36, thereby making the porosity layer 21 porous. At this time, current flows as indicated by arrows a, b, c of broken lines between the pair of electrodes 34, 35 in the figure. For example, mixture liquid of 50% hydrogen fluoride solution and ethyl alcohol is used as the electrolyte, and the current flowing to the electrodes 34, 35 is set to 10 to 200 $mA/cm^2$, for example, and the moving speed of the electrodes 34, 35 is set to 1 cm/minute, for example.

Here, when the electrodes 34, 35 (support member 36) is moved from the left to the right as indicated by a heavy arrow in the figure, the current density inducing anodization (the density of current flowing into the porosity layer 21 from the electrolyte) at the position $X_1$ of the porosity layer 21 below the electrode 34 is larger than that at the position $X_2$ which is nearer to the electrode 35. That is, in the anodization process, the larger the current density is, the higher the porosity is. Therefore, the porosity at the position $X_1$ is higher than that at the position $X_2$.

Figure 9:
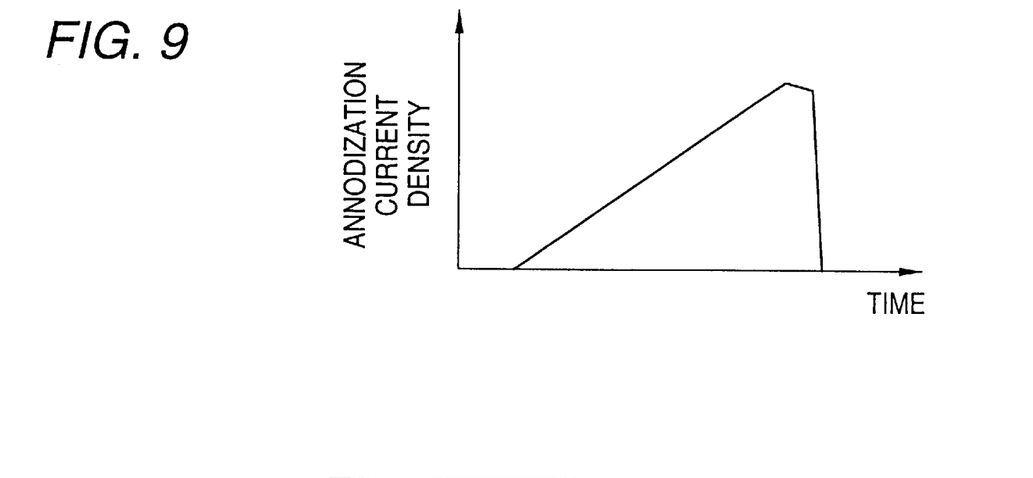
FIG. 9 is a characteristic diagram showing the relationship between the current density and time of a porosity layer.

At the position $X_3$ just between the electrode 34 and the electrode 35, the current density inducing the anodization is substantially equal to zero because it is far away from the electrode 34 before the electrodes 34, 35 are moved. However, as shown in FIG. 9, upon start of the movement, the current density inducing the anodization is gradually increased, and it is maximum when the electrode 34 most approaches to it. When the electrode 34 is slightly displaced from it, the current density is rapidly reduced to zero. Accordingly, at the position $X_3$, the surface portion is made porous at a low porosity because the current density is first low. When the electrodes 34, 35 are moved, the current density is increased in accordance with the movement, and thus the porosity layer is made porous at a porosity which is gradually enhanced from the surface portion to the substrate body 11. Further, when the electrode 34 is closest, the current density is maximum, and thus the a portion having the highest porosity is formed at a position nearer to the substrate body 11.

Even at each position (position $X_4$, $X_5$ . . . ) at the right side from the position $X_3$, the current density inducing the anodization is varied in accordance with the movement of the electrodes 34, 35 as in the case of the position $X_3$, and the porosity layer is likewise made porous. Accordingly, the movement of the electrodes 34, 35 makes the overall porosity layer substantially uniformly porous.

The separation layer 12 is formed as described above, and then heated under a hydrogen ($H_2$) atmosphere (for example, 1100° C.) to smoothen the surface of the separation layer 12 (heating step).

Figure 6D:
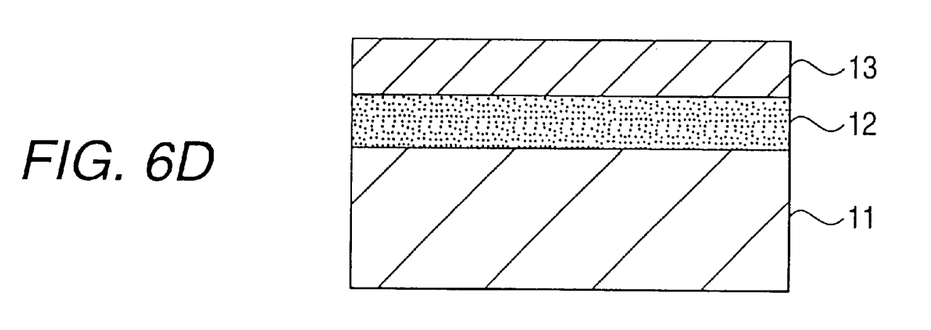

Thereafter, as shown in FIG. 6D, the semiconductor thin film 13 of semiconductor is formed on the separation layer 12. For example, the semiconductor thin film 13 of single crystal silicon is epitaxially grown with silane gas by the CVD method (semiconductor thin film forming step). In the separation layer 12, recystallization occurs due to the heating step and the semiconductor thin film forming step, and the portion having high porosity is remarkably weaken in strength. Through this operation, the semiconductor substrate is formed.

Figure 7A:
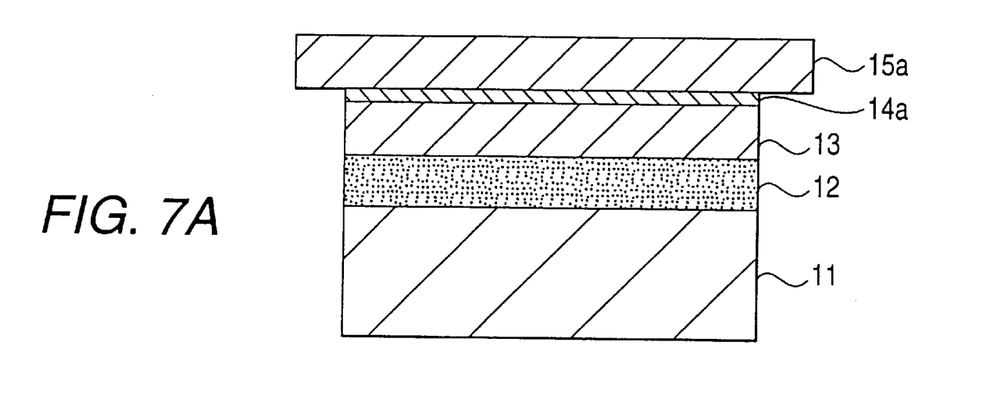
FIGS. 7A to 7C are each step diagrams showing the thin film semiconductor device which is subsequent to FIG. 6.
Figure 7B:
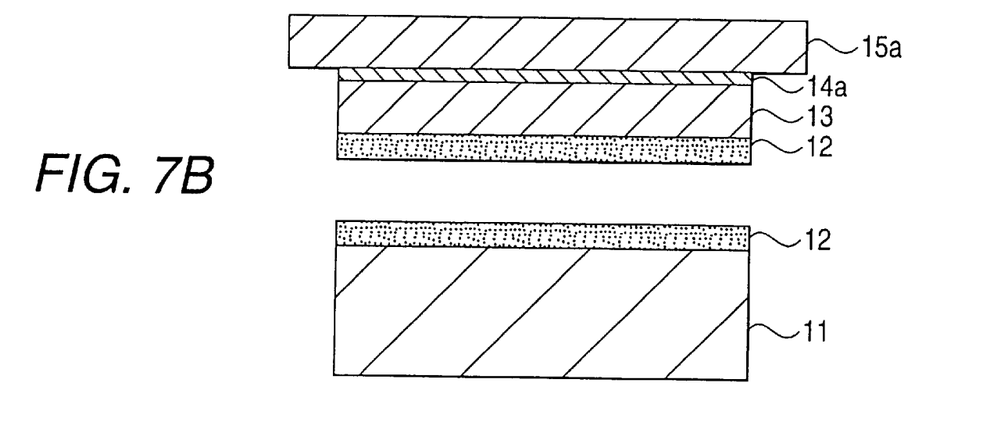
Figure 7C:
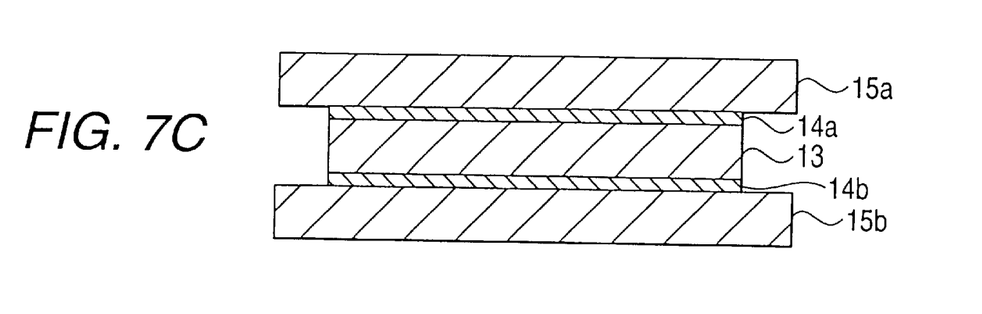

After the semiconductor substrate is formed as described above, the semiconductor thin film 13 is subjected to a suitable treatment in accordance with its application purpose. For example, when it is applied as a solar battery, an n-type diffusion layer, an antireflection film and an electrode are formed by diffusing impurities into the semiconductor thin film 13. Thereafter, as shown in FIG. 7A, a suitable adhesive substrate 15a is attached to the surface of the semiconductor thin film 13 by a suitable adhesive layer 14a, and as shown in FIG. 7B, the substrate body 11 and the adhesive substrate 15a are pulled to the opposite sides to each other to separate them from each other through the separation layer 12a (separation step), whereby the semiconductor thin film 13 is separated from the substrate body 11 and transferred to the adhesive substrate 15. In order to separate the semiconductor thin film 13 as described above, adhesive agent which is higher in adhesive strength than that of the separation layer 12 is preferably used as the adhesive agent constituting the adhesive layer 14a. The separation layer 12 adhering to the separated semiconductor thin film 13 is removed therefrom, and an adhesive substrate 15b is adhesively attached to the semiconductor thin film 13 through an adhesive layer 14b, thereby achieving a thin film semiconductor device such as a solar battery or the like (see FIG. 7C).

In the semiconductor thin film 13 thus separated, the separation layer 12 attached is removed by an etching treatment, and then a suitable adhesive substrate 15a is attached to the surface thereof by a suitable adhesive layer 14b, thereby achieving the thin film semiconductor device. Further, with respect to the substrate body 11 thus separated, the separation layer 12 attached is removed by the etching treatment, and it is used for manufacturing of a semiconductor substrate and a thin film semiconductor device again.

As described above, according to the semiconductor substrate of this embodiment, the substrate body 11 is formed of sapphire, and thus even when the substrate body 11 is repetitively reused, the deterioration and the damage thereof can be suppressed. Accordingly, the recycle frequency of the substrate body 11 can be increased, and the reduction of the manufacturing cost and the saving of the resource can be performed. Further, the area of the substrate body 11 can be increased, so that a large-area semiconductor thin film 13, that is, a large-area thin film semiconductor device can be formed, and the manufacturing cost can be further reduced. In addition, the wasting of the materials can be suppressed, and the saving of the resources can be further promoted.

According to the thin film semiconductor device of this embodiment, the semiconductor thin film 13 separated from the semiconductor substrate according to this embodiment is used, so that the reduction of the manufacturing cost and the saving of the resources can be promoted as in the case of the semiconductor substrate of this embodiment.

According to the anodizing apparatus of this embodiment, the anodization is performed while a pair of electrodes 34, 35 are moved at one surface side of the porosity layer 21, so that the separation layer 12 can be easily formed even when the substrate body 11 formed of sapphire which is insulate is used. Accordingly, the semiconductor substrate and the thin film semiconductor device according to this embodiment can be easily implemented.

Further, when the anodization is performed over a large area, it is general that the porosity becomes non-uniform due to unevenness of the resistance distribution of the separation layer 12 and unevenness of the current density. However, according to the anodizing apparatus of this embodiment, the electrodes 34, 35 are moved, so that the range in which the current flows is narrow and even when the anodization is performed over a large area, the porosity in the direction parallel to the surface can be made uniform. Accordingly, the separation of the separation layer 12 can be facilitated.

Further, a pair of electrodes 34, 35 are disposed at one surface side of the porosity layer 21, so that the current density can be varied by moving the electrodes, and the porosity in the thickness direction of the separation layer 12 can be easily varied. Accordingly, the separation in the separation layer 12 can be facilitated.

According to the semiconductor substrate manufacturing method of this embodiment, the separation layer 12 is formed by using the anodizing apparatus of this embodiment. Therefore, the semiconductor substrate according to this embodiment can be easily formed. Accordingly, the semiconductor substrate according to this embodiment can be easily implemented. Further, the porosity in the direction parallel to the surface of the separation layer 12 can be made uniform, and the separation in the separation layer 12 can be facilitated. Still further, the porosity in the thickness direction of the separation layer 12 can be easily varied.

According to the thin film semiconductor device manufacturing method according to this embodiment, it contains the semiconductor substrate manufacturing method of this embodiment, so that the same effect as the semiconductor substrate manufacturing method according to this embodiment can be achieved.

(Second Embodiment)

Figure 10:
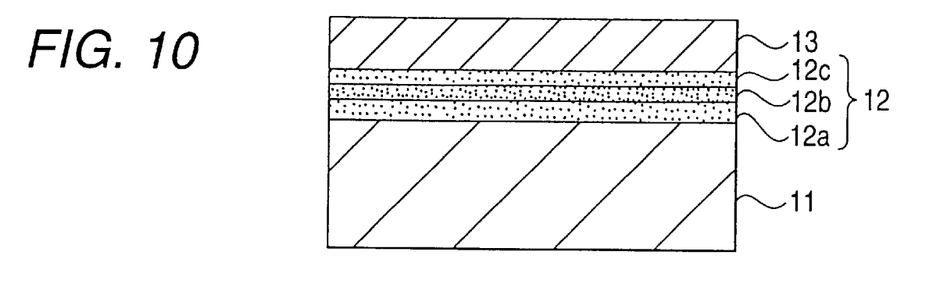
FIG. 10 is a cross-sectional view showing the construction of the semiconductor substrate according to a second embodiment of the present invention.

FIG. 10 shows the construction of a semiconductor substrate according to a second embodiment. The semiconductor substrate has the same construction as the semiconductor substrate of the first embodiment except that the construction of the separation layer 12 is different. Accordingly, in this case, the same constituent elements are represented by the same reference numerals, and the detailed description thereof is omitted.

The separation layer 12 comprises plural layers which are different in impurities concentration and in porosity, and the impurities concentration and the porosity are varied in the thickness direction. For example, the separation layer 12 contains a low porous layer 12a which is about $2 \times 10^{19}$ cm$^{-3}$ in impurities concentration and low in porosity, a high porous layer 12b which is about $1 \times 10^{14}$ to $1 \times 10^{18}$ cm$^{-3}$ in impurities concentration and high in porosity, and a low porous layer 12c which is about $2 \times 10^{19}$ cm$^{-3}$ in impurities concentration and low in porosity, these porous layers being formed from the substrate body 11 side in this order. The impurities concentration is varied between each low porous layer 12a, 12c and the high porous layer 12b as described above for the following reason. That is, when the separation layer 12 is formed by the anodization, the porosity thereof is controlled in accordance with the impurities concentration, and the moving speed of the electrodes 34, 35 is increased without increasing the current density. The high porous layer 12b is used to separate the semiconductor thin film 13 from the substrate body 11, and the porosity thereof is preferably set to about 40 to 70% in order to easily separate them.

The separation layer 12 does not necessarily comprise the low porous layer 12a, the high porous layer 12b and the low porous layer 12c, however, it is preferable that the layer adjacent to the semiconductor thin film 13 is the low porous layer 12c having low porosity. This is to form a semiconductor thin film 13 having excellent crystallinity on the surface of the separation layer 12. Further, the impurities concentration and the porosity in the thickness direction in the low porous layers 12a, 12c and the high porous layer 12b may be varied.

Figure 11:
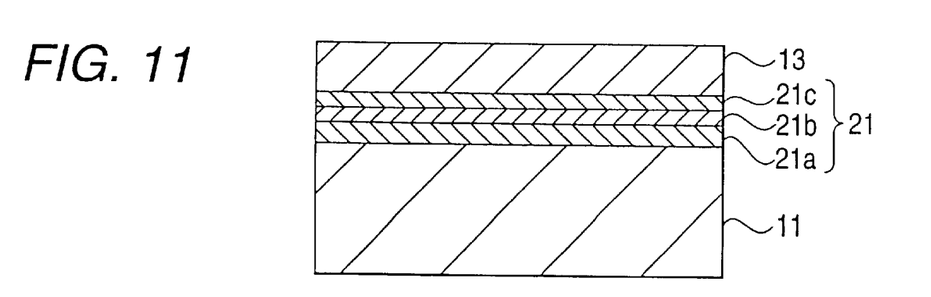
FIG. 11 is a cross-sectional view showing the semiconductor substrate manufacturing method shown in FIG. 10.

The semiconductor substrate thus constructed can be formed in the same manner as the first embodiment except that the addition concentration of the impurities is varied when the porosity layer 21 is formed. That is, when the porosity layer 21 is formed, as shown in FIG. 11, a high concentration layer of about $2 \times 10^{19}$ cm$^{-3}$ in impurities concentration, a low concentration layer 21b of $1 \times 10^{14}$ to $1 \times 10^{18}$ cm$^{-3}$ in impurities concentration, and a high concentration 21c of about $2 \times 10^{19}$ cm$^{-3}$ in impurities concentration are formed from the substrate body 11 side in this order (porosity layer forming step).

Thereafter, when the separation layer 12 is formed by anodization, the porosity layer 21 is easily made porous because it has the impurities concentration which varies in the thickness direction. Assuming that the electrodes 34, 35 have the same moving speed, the current density flowing into the electrodes 34, 35 is equal to 3 to 50 mA/cm$^2$ which is smaller than that of the first embodiment. Further, the high concentration layers 21a, 21c having low resistance are formed on the porosity layer 21, so that current is more liable to flow in the porosity layer 21 than in the electrolyte. Accordingly, the amount of the current which does not flows through the porosity layer 21, but flows through only the electrolyte is reduced, and also the current which flows into the porosity layer 21 passes through not only the high concentration layer 21c, but also the low concentration layer 21b and thus flows into the high concentration layer 21a, whereby the porosity layer 21 becomes the porous layer 12 whose porosity is varied in accordance with the impurities concentration. That is, the high concentration layer 21a becomes the low porous layer 12a, the high concentration layer 21b becomes the low porous layer 12b, and the high concentration layer 21c becomes the low porous layer 12c.

Further, in the heating step and the semiconductor thin film forming step, the low porous layers 12a, 12c have high impurities concentration, and thus they are easily recrystallized and micro-holes are reduced.

As described above, according to this embodiment, the impurities concentration of the separation layer 12, that is, the porosity layer 21 is variable, so that the current density in the anodization process can be reduced. Accordingly, the moving speed of the electrodes 34, 35 can be increased without increasing the current density, and thus the problem occurring due to increase of the current density, that is, the problem that the porosity is non-uniform due to unevenness of the current density or a large amount hydrogen can be prevented. That is, the porosity in the direction parallel to the surface of the separation layer 12 can be made uniform. Further, the moving speed of the electrodes 34, 35 can be increased, and the manufacturing time can be shortened.

Further, the high concentration layers 21a, 21c having high impurities concentration are formed in the porosity layer 21. Therefore, the resistance of the porosity layer 21 can be reduced, and the current is liable to flow into the porosity layer 21 in the anodization process. Further, the recrystallization is liable to be induced if the impurities concentration is high, and thus most of the low porous layer 12c can be recrystallized. Accordingly, even when the low porous layer 12c attached to the semiconductor thin film 13 is not removed after the semiconductor thin film 13 is separated through the separation layer 12 (high porous layer 12b), it can be directly used as the electrode in such a case that the semiconductor thin film 13 is used as a solar battery. Therefore, the manufacturing process can be simplified.

As in the case of the first embodiment, in the semiconductor substrate, the semiconductor thin film 13 is used for a thin film semiconductor device, it can be manufactured in the same manner as the semiconductor substrate of this embodiment, and the same effect as the semiconductor substrate and the manufacturing method thereof according to this embodiment can be achieved.

The present invention was made by describing the embodiments and each example, however, the present invention is not limited to the embodiments and the examples, and various modifications may be made. For example, in each embodiment, the description is made only in the case where the anodizing apparatus is used when the porosity layer 21 formed on the insulating substrate body 11 is made porous. However, the anodizing apparatus of the present invention may be used when other porosity targets are made porous. Specifically, it may be used when a porosity layer formed on the surface of a conductive substrate body (for example, substrate body of p-type silicon) or at one surface side thereof is made porous. Particularly, when the area of a porosity target is large, the porosity in the direction parallel to the surface can be more uniform as compared with the conventional anodizing apparatus.

In the above second embodiment, the separation layer 12 maybe formed of plural layers which are different in impurities concentration. However, it may be designed so that the impurities concentration in the thickness direction is continuously varied.

As described above, according to the semiconductor substrate of the present invention, the substrate body is formed of sapphire, so that the deterioration and damage of the substrate body can be suppressed even when the substrate body is repetitively reused. Accordingly, there can be achieved the effects that the recycle frequency of the substrate body can be increased, and the reduction of the manufacturing cost and the saving of the resources can be promoted. Further, the area of the substrate body can be increased, so that the large-area semiconductor thin film, that is, the large-area thin film semiconductor device can be formed. Therefore, there can be achieved the effects that the manufacturing cost can be further reduced, and also the wasting of the material can be suppressed, so that the saving of the resources can be further promoted.

According to the thin film semiconductor device of the present invention, the semiconductor thin film separated from the semiconductor substrate is used, so that there can be achieved the effect that the reduction of the manufacturing cost and the saving of the resources can be promoted as in the case of the semiconductor substrate of the present invention.

According to the anodizing apparatus of the present invention, a pair of electrodes are moved at one surface side of the porous layer, so that the insulating substrate body can be easily made porous. Accordingly, there can be achieved the effect that the semiconductor substrate and the thin film device can be easily implemented. Further, there can be achieved the effects that the current-flowing range can be narrowed, and even when anodization is performed on the porous layer having a large area, the porosity in the direction parallel to the surface can be made uniform. Further, there can be achieved the effects that the current density can be varied by moving the electrodes, and the porosity in the thickness direction of the porosity layer can be easily varied.

According to the semiconductor substrate manufacturing method of the present invention, the separation layer is formed by using the anodizing apparatus of the present invention. Therefore, the semiconductor substrate of the present invention can be easily formed. Accordingly, there can be achieved the effect that the semiconductor substrate of the present invention can be easily implemented. Further, there can be achieved the effect that the porosity in the direction parallel to the surface of the separation layer can be uniform, and the separation of the separation layer can be facilitated. Further, there can be also achieved the effect that the porosity in the thickness direction of the separation layer can be easily varied.

According to the thin film semiconductor device manufacturing method of the present invention, it contains the semiconductor substrate manufacturing method of the present invention, so that the same effect as the semiconductor substrate manufacturing method of the present invention can be achieved.

What is claimed is:

1. A method of separating a semiconductor film comprising the steps of:

forming a first semiconductor layer on a sapphire substrate, the first semiconductor layer comprising a first layer having a first impurity concentration and a second layer having a second impurity concentration higher than said first impurity concentration;

anodizing said first semiconductor layer so as to convert said first layer into a first porous layer having a first porosity and said second layer into a second porous layer having a second porosity higher than said first porosity;

forming a second semiconductor layer on said first semiconductor layer; and separating said second semiconductor layer from said sapphire substrate.

2. The method as defined in claim 1; wherein said anodizing is conducted by moving a pair of electrodes above a surface of said first semiconductor layer in an electrolyte so as to generate a current flow in said first semiconductor layer.

* * * * *